United States Patent
Hey-Shipton et al.

(10) Patent No.: US 12,224,732 B2
(45) Date of Patent: *Feb. 11, 2025

(54) SOLIDLY-MOUNTED TRANSVERSELY-EXCITED FILM BULK ACOUSTIC RESONATORS AND FILTERS FOR 27 GHZ COMMUNICATIONS BANDS

(71) Applicant: Murata Manufacturing Co., Ltd., Nagaokakyo (JP)

(72) Inventors: Gregory L. Hey-Shipton, Santa Barbara, CA (US); Neal Fenzi, Santa Barbara, CA (US); Mike Eddy, Santa Barbara, CA (US); Ventsislav Yantchev, Sofia (BG)

(73) Assignee: Murata Manufacturing Co., Ltd., Nagaokakyo (JP)

(*) Notice: Subject to any disclaimer, the term of this patent is extended or adjusted under 35 U.S.C. 154(b) by 542 days.

This patent is subject to a terminal disclaimer.

(21) Appl. No.: 17/558,090

(22) Filed: Dec. 21, 2021

(65) Prior Publication Data

US 2022/0116010 A1    Apr. 14, 2022

Related U.S. Application Data

(63) Continuation-in-part of application No. 16/896,147, filed on Jun. 8, 2020, now Pat. No. 11,264,966, which
(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 5,274,345 A    12/1993  Gau
5,446,330 A    8/1995   Eda et al.
(Continued)

FOREIGN PATENT DOCUMENTS

CN    106788318 A    5/2017
CN    110417373 A    11/2019
(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
(Continued)

*Primary Examiner* — Hafizur Rahman
(74) *Attorney, Agent, or Firm* — ArentFox Schiff LLP

(57) ABSTRACT

Resonator devices and filter devices are disclosed. An acoustic resonator includes a substrate and a piezoelectric plate having front and back surfaces separated by a piezoelectric plate thickness greater than or equal to 50 nm and less than or equal to 200 nm. An acoustic Bragg reflector is between the substrate and the back surface of the piezoelectric plate. A conductor pattern including an interdigital transducer (IDT) is on the front surface of the piezoelectric plate.

18 Claims, 11 Drawing Sheets

Related U.S. Application Data is a continuation-in-part of application No. 16/779,306, filed on Jan. 31, 2020, now Pat. No. 11,165,407, which is a continuation of application No. 16/438,141, filed on Jun. 11, 2019, now Pat. No. 10,601,392, which is a continuation-in-part of application No. 16/230,443, filed on Dec. 21, 2018, now Pat. No. 10,491,192.

(60) Provisional application No. 63/251,459, filed on Oct. 1, 2021, provisional application No. 63/000,006, filed on Mar. 26, 2020, provisional application No. 62/818,564, filed on Mar. 14, 2019, provisional application No. 62/753,815, filed on Oct. 31, 2018, provisional application No. 62/753,809, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
  H03H 9/13 (2006.01)
  H03H 9/17 (2006.01)
  H03H 9/56 (2006.01)

(52) U.S. Cl.
  CPC ............ H03H 9/132 (2013.01); H03H 9/175 (2013.01); H03H 9/176 (2013.01); H03H 9/562 (2013.01); H03H 9/564 (2013.01); H03H 9/568 (2013.01); *H03H 2003/025* (2013.01)

(58) Field of Classification Search
  CPC ........ H03H 9/176; H03H 9/562; H03H 9/564; H03H 9/568; H03H 2003/023; H03H 2003/0442
  USPC ........................................................ 333/192
  See application file for complete search history.

(56) References Cited

U.S. PATENT DOCUMENTS

| | | | |
|---|---|---|---|
| 5,552,655 | A | 9/1996 | Stokes et al. |
| 5,631,515 | A | 5/1997 | Mineyoshi et al. |
| 5,726,610 | A | 3/1998 | Allen et al. |
| 5,853,601 | A | 12/1998 | Krishaswamy |
| 6,377,140 | B1 | 4/2002 | Ehara et al. |
| 6,516,503 | B1 | 2/2003 | Ikada et al. |
| 6,540,827 | B1 | 4/2003 | Levy et al. |
| 6,570,470 | B2 | 5/2003 | Maehara et al. |
| 6,670,866 | B2 | 12/2003 | Ella et al. |
| 6,707,229 | B1 | 3/2004 | Martin |
| 6,710,514 | B2 | 3/2004 | Ikada et al. |
| 6,833,774 | B2 | 12/2004 | Abbott et al. |
| 7,312,674 | B2 | 12/2007 | Duwel et al. |
| 7,345,400 | B2 | 3/2008 | Nakao et al. |
| 7,463,118 | B2 | 12/2008 | Jacobsen |
| 7,498,904 | B2 | 3/2009 | Ohara et al. |
| 7,535,152 | B2 | 5/2009 | Ogami et al. |
| 7,554,427 | B2 | 6/2009 | Matsumoto |
| 7,684,109 | B2 | 3/2010 | Godshalk et al. |
| 7,728,483 | B2 | 6/2010 | Tanaka |
| 7,868,519 | B2 | 1/2011 | Umeda |
| 7,939,987 | B1 | 5/2011 | Solal et al. |
| 7,941,103 | B2 | 5/2011 | Iwamoto et al. |
| 7,965,015 | B2 | 6/2011 | Tai et al. |
| 8,278,802 | B1 | 10/2012 | Lee et al. |
| 8,294,330 | B1 | 10/2012 | Abbott et al. |
| 8,344,815 | B2 | 1/2013 | Yamanaka et al. |
| 8,816,567 | B2 | 8/2014 | Zuo et al. |
| 8,829,766 | B2 | 9/2014 | Milyutin et al. |
| 8,932,686 | B2 | 1/2015 | Hayakawa et al. |
| 9,093,979 | B2 | 7/2015 | Wang |
| 9,112,134 | B2 | 8/2015 | Takahashi |
| 9,130,145 | B2 | 9/2015 | Martin et al. |
| 9,148,121 | B2 | 9/2015 | Inoue |
| 9,154,111 | B2 | 10/2015 | Bradley |
| 9,219,466 | B2 | 12/2015 | Meltaus et al. |
| 9,240,768 | B2 | 1/2016 | Nishihara et al. |
| 9,276,557 | B1 | 3/2016 | Nordquist et al. |
| 9,369,105 | B1 | 6/2016 | Li et al. |
| 9,425,765 | B2 | 8/2016 | Rinaldi |
| 9,525,398 | B1 | 12/2016 | Olsson |
| 9,640,750 | B2 | 5/2017 | Nakanishi et al. |
| 9,748,923 | B2 | 8/2017 | Kando et al. |
| 9,762,202 | B2 | 9/2017 | Thalmayr et al. |
| 9,780,759 | B2 | 10/2017 | Kimura et al. |
| 9,837,984 | B2 | 12/2017 | Khlat et al. |
| 10,079,414 | B2 | 9/2018 | Guyette et al. |
| 10,187,039 | B2 | 1/2019 | Komatsu et al. |
| 10,200,013 | B2 | 2/2019 | Bower et al. |
| 10,211,806 | B2 | 2/2019 | Bhattacharjee |
| 10,284,176 | B1 | 5/2019 | Solal |
| 10,389,391 | B2 | 8/2019 | Ito |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,644,674 | B2 | 5/2020 | Takamine |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,812,048 | B2 | 10/2020 | Nosaka |
| 10,819,309 | B1 | 10/2020 | Turner et al. |
| 10,819,319 | B1 | 10/2020 | Hyde |
| 10,826,462 | B2 | 11/2020 | Plesski et al. |
| 10,868,510 | B2 | 12/2020 | Yantchev et al. |
| 10,868,512 | B2 | 12/2020 | Garcia et al. |
| 10,868,513 | B2 | 12/2020 | Yantchev |
| 10,911,017 | B2 | 2/2021 | Plesski |
| 10,911,021 | B2 | 2/2021 | Turner et al. |
| 10,911,023 | B2 | 2/2021 | Turner |
| 10,917,070 | B2 | 2/2021 | Plesski et al. |
| 10,917,072 | B2 | 2/2021 | McHugh et al. |
| 10,985,726 | B2 | 4/2021 | Plesski |
| 10,985,728 | B2 | 4/2021 | Plesski et al. |
| 10,985,730 | B2 | 4/2021 | Garcia |
| 10,992,282 | B1 | 4/2021 | Plesski et al. |
| 10,992,283 | B2 | 4/2021 | Plesski et al. |
| 10,992,284 | B2 | 4/2021 | Yantchev |
| 10,998,877 | B2 | 5/2021 | Turner et al. |
| 10,998,882 | B2 | 5/2021 | Yantchev et al. |
| 11,003,971 | B2 | 5/2021 | Plesski et al. |
| 11,114,996 | B2 | 9/2021 | Plesski et al. |
| 11,114,998 | B2 | 9/2021 | Garcia et al. |
| 11,139,794 | B2 | 10/2021 | Plesski et al. |
| 11,143,561 | B2 | 10/2021 | Plesski |
| 11,146,231 | B2 | 10/2021 | Plesski |
| 11,146,232 | B2 | 10/2021 | Yandrapalli et al. |
| 11,146,238 | B2 | 10/2021 | Hammond et al. |
| 11,146,244 | B2 | 10/2021 | Yantchev |
| 11,165,407 | B2 | 11/2021 | Yantchev |
| 11,171,629 | B2 | 11/2021 | Turner |
| 11,201,601 | B2 | 12/2021 | Yantchev et al. |
| 11,323,089 | B2 | 5/2022 | Turner |
| 11,368,139 | B2 | 6/2022 | Garcia |
| 11,949,399 | B2* | 4/2024 | Yantchev ............... H03H 9/132 |
| 2002/0079986 | A1 | 6/2002 | Ruby et al. |
| 2002/0130736 | A1 | 9/2002 | Mukai |
| 2002/0158714 | A1 | 10/2002 | Kaitila et al. |
| 2002/0189062 | A1 | 12/2002 | Lin et al. |
| 2003/0080831 | A1 | 5/2003 | Naumenko et al. |
| 2003/0199105 | A1 | 10/2003 | Kub et al. |
| 2004/0041496 | A1 | 3/2004 | Imai et al. |
| 2004/0100164 | A1 | 5/2004 | Murata |
| 2004/0207033 | A1 | 10/2004 | Koshido |
| 2004/0207485 | A1 | 10/2004 | Kawachi et al. |
| 2004/0261250 | A1 | 12/2004 | Kadota et al. |
| 2005/0099091 | A1 | 5/2005 | Mishima |
| 2005/0185026 | A1 | 8/2005 | Noguchi et al. |

(56) References Cited

U.S. PATENT DOCUMENTS

| | | |
|---|---|---|
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0090898 A1 | 4/2007 | Kando |
| 2007/0115079 A1 | 5/2007 | Kubo et al. |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0278898 A1 | 12/2007 | Miura et al. |
| 2007/0296304 A1 | 12/2007 | Fujii et al. |
| 2008/0018414 A1 | 1/2008 | Inoue et al. |
| 2008/0246559 A1 | 10/2008 | Ayazi |
| 2008/0297280 A1 | 12/2008 | Thalhammer |
| 2009/0273415 A1 | 11/2009 | Frank |
| 2010/0019866 A1 | 1/2010 | Hara et al. |
| 2010/0064492 A1 | 3/2010 | Tanaka |
| 2010/0123367 A1 | 5/2010 | Tai et al. |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0278993 A1 | 11/2011 | Iwamoto |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0042417 A1 | 2/2015 | Onodera et al. |
| 2015/0165479 A1 | 6/2015 | Lasiter et al. |
| 2015/0244149 A1 | 8/2015 | Van Someren |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0049920 A1 | 2/2016 | Kishino |
| 2016/0079958 A1 | 3/2016 | Burak |
| 2016/0087187 A1 | 3/2016 | Burak |
| 2016/0182009 A1 | 6/2016 | Bhattacharjee |
| 2016/0285430 A1 | 9/2016 | Kikuchi et al. |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0212589 A1 | 7/2018 | Meltaus et al. |
| 2018/0278227 A1 | 9/2018 | Hurwitz |
| 2019/0007022 A1 | 1/2019 | Goto et al. |
| 2019/0068155 A1 | 2/2019 | Kimura |
| 2019/0068164 A1 | 2/2019 | Houlden et al. |
| 2019/0074813 A1 | 3/2019 | Zou et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2019/0386638 A1 | 12/2019 | Kimura et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0244247 A1 | 7/2020 | Maeda |
| 2020/0259480 A1 | 8/2020 | Pensala |
| 2020/0295729 A1 | 9/2020 | Yantchev |
| 2020/0304091 A1 | 9/2020 | Yantchev |
| 2020/0313645 A1 | 10/2020 | Caron |
| 2020/0350891 A1 | 11/2020 | Turner et al. |
| 2021/0013859 A1 | 1/2021 | Turner et al. |
| 2021/0273631 A1 | 9/2021 | Jachowski et al. |
| 2021/0328574 A1 | 10/2021 | Garcia |
| 2022/0103160 A1 | 3/2022 | Jachowski et al. |
| 2022/0116014 A1 | 4/2022 | Poirel |
| 2022/0149808 A1 | 5/2022 | Dyer et al. |
| 2022/0200567 A1 | 6/2022 | Garcia |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2018093487 A | 6/2018 |
| JP | 2018166259 A | 10/2018 |
| JP | 2018207144 A | 12/2018 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 7/2016 |
| WO | 2016147687 A1 | 9/2016 |
| WO | 2017188342 A1 | 11/2017 |
| WO | 2018003268 A1 | 1/2018 |
| WO | 2018003273 | 1/2018 |
| WO | 2018163860 A1 | 9/2018 |

(56) References Cited

FOREIGN PATENT DOCUMENTS

| | | |
|---|---|---|
| WO | 2019138810 A1 | 7/2019 |
| WO | 2020092414 A2 | 5/2020 |
| WO | 2020100744 A1 | 5/2020 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. 1, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 (2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) Jan. 2015.

Gorisse et al., "Lateral Field Excitation of membrane-based Aluminum Nitride resonators," Joint Conference of the IEEE International Frequency Control and the European Frequency and Time Forum (FCS), May 2011, 5 pages.

Pang et al., "Self-Aligned Lateral Field Excitation Film Acoustic Resonator with Very Large Electromechanical Coupling," IEEE International Ultrasonics, Ferroelectrics, and Frequency Control Joint 50th Anniversary Conference, Aug. 2004, pp. 558-561.

Yandrapalli et al., "Toward Band n78 Shear Bulk Acoustic Resonators Using Crystalline Y-Cut Lithium Niobate 3 Films With Spurious Suppression," Journal of Microelectromechanical System, Aug. 2023, vol. 32, No. 4, pp. 327-334.

International Search Report and Written Opinion in PCT/US2022/081068, mailed Apr. 18, 2023, 17 pages.

Office Action in JP2021175220, mailed Apr. 25, 2023, 10 pages.

\* cited by examiner

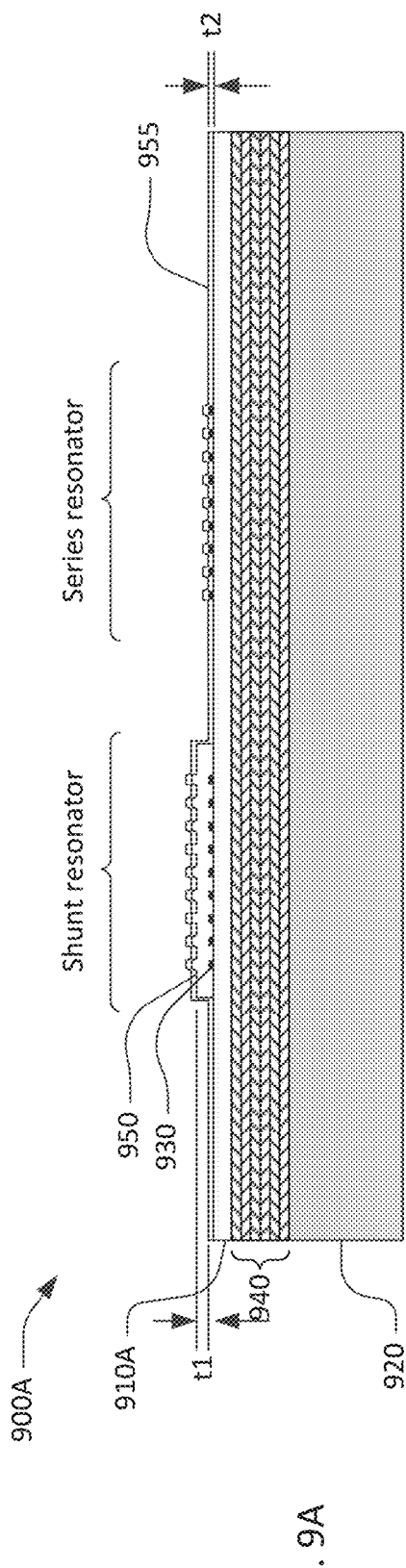
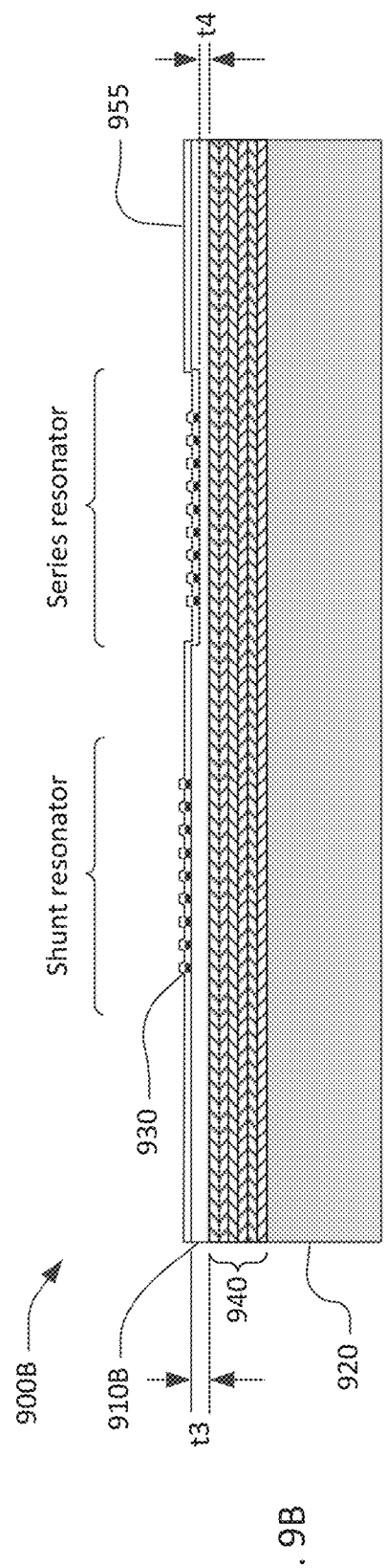
FIG. 9A
FIG. 9B

SOLIDLY-MOUNTED TRANSVERSELY-EXCITED FILM BULK ACOUSTIC RESONATORS AND FILTERS FOR 27 GHZ COMMUNICATIONS BANDS

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application 63/251,459, filed Oct. 1, 2021, titled SOLIDLY MOUNTED MMW XBAR FILTERS. This patent is a continuation in part of application Ser. No. 16/896,147, filed Jun. 8, 2020, titled SOLIDLY-MOUNTED TRANSVERSELY-EXCITED FILM BULK ACOUSTIC RESONATOR WITH DIAMOND LAYERS IN BRAGG REFLECTOR STACK, which claims priority from provisional patent application 63/000,006, filed Mar. 26, 2020, titled SM-XBAR WITH DIAMOND LAYERS IN ACOUSTIC BRAGG REFLECTOR. application Ser. No. 16/896,147 is a continuation-in-part of application Ser. No. 16/779,306, filed Jan. 31, 2020, titled SOLIDLY-MOUNTED TRANSVERSELY-EXCITED FILM BULK ACOUSTIC RESONATOR, now U.S. Pat. No. 11,165,407, which is a continuation of application Ser. No. 16/438,141, filed Jun. 11, 2019, titled SOLIDLY-MOUNTED TRANSVERSELY-EXCITED FILM BULK ACOUSTIC RESONATOR, now U.S. Pat. No. 10,601,392, which claims priority from provisional patent application 62/753,809, filed Oct. 31, 2018, titled SOLIDLY MOUNTED SHEAR-MODE FILM BULK ACOUSTIC RESONATOR, and provisional patent application 62/818,564, filed Mar. 14, 2019, titled SOLIDLY MOUNTED XBAR. application Ser. No. 16/438,141 is a continuation-in-part of application Ser. No. 16/230,443, filed Dec. 21, 2018, titled TRANSVERSELY-EXCITED FILM BULK ACOUSTIC RESONATOR, now U.S. Pat. No. 10,491,192, which claims priority from the following provisional applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands falling just below the lower edge of what is commonly termed "millimeter waves" (MMW). Three of these new communications bands are n257 (26.5 GHz to 29.5 GHz), n258 (24.5 GHz to 27.5 GHz), and n261 (27.5 GHz to 28.35 GHz.) These bands will be collectively referred to herein as "27 GHz communications bands." Bands n257, n258, and n261 use time-division duplexing (TDD), such that the same frequencies are used for both uplink and downlink transmissions. Bandpass filters for communications devices using TDD must be capable of handling the transmit power of the communications device.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

A solidly-mounted transversely-excited film bulk acoustic resonator (SM-XBAR) is an acoustic resonator structure similar to an XBAR except that the thin piezoelectric layer is on an acoustic Bragg reflector rather than floating. SM-XBAR is described in U.S. Pat. No. 10,601,392, titled SOLIDLY-MOUNTED TRANSVERSELY-EXCITED FILM BULK ACOUSTIC RESONATOR.

DESCRIPTION OF THE DRAWINGS

FIG. 9A is a schematic cross-sectional view of a filter with a dielectric layer to set a frequency separation between shunt resonators and series resonators.

FIG. 9B is a schematic cross-sectional view of a filter with different piezoelectric diaphragm thicknesses to set a frequency separation between shunt resonators and series resonators.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
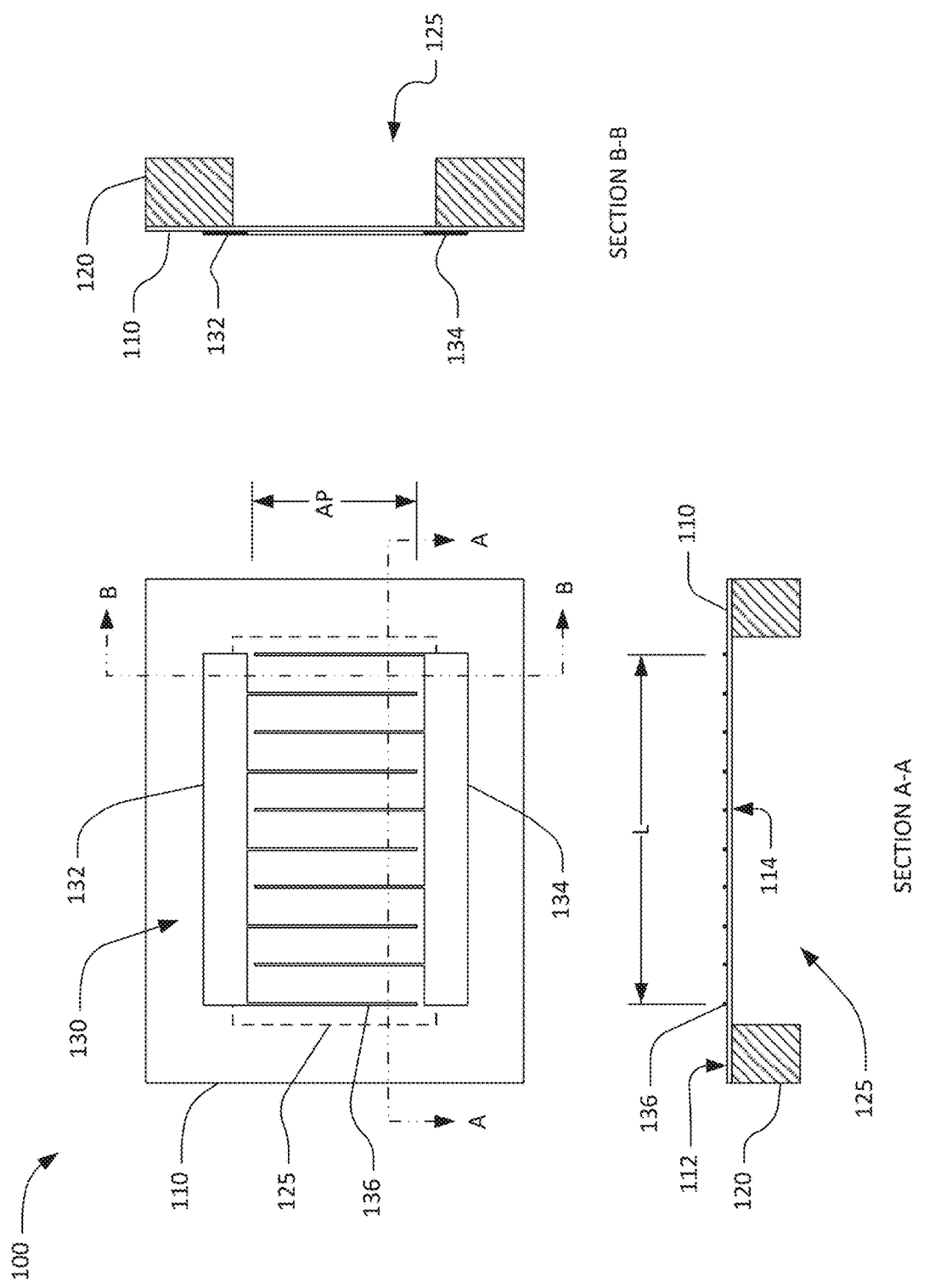
FIG. 1 includes a schematic plan view and schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in application Ser. No. 16/230,443, TRANSVERSELY-EXCITED FILM BULK ACOUSTIC RESONATOR. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
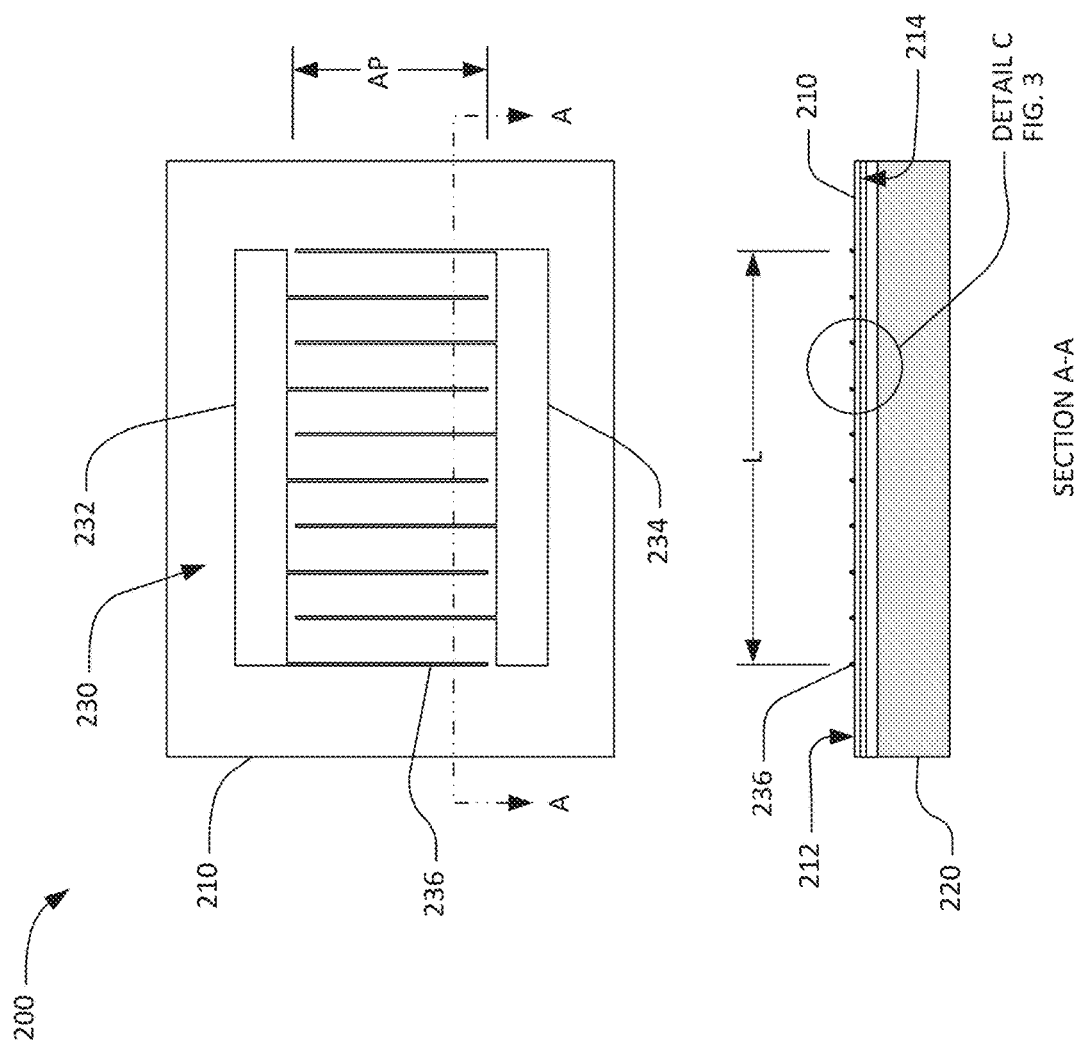
FIG. 2 includes a schematic plan view and a schematic cross-sectional view of a solidly-mounted transversely-excited film bulk acoustic resonator (SM XBAR).

FIG. 2 shows a simplified schematic top view and an orthogonal cross-sectional view of a solidly-mounted transversely-excited film bulk acoustic resonator (SM XBAR) 200. SM XBAR resonators such as the resonator 200 may be used in a variety of RF filters including band-reject filters, band-pass filters, duplexers, and multiplexers. SM XBARs are particularly suited for use in filters for communications bands with frequencies above 3 GHz.

The SM XBAR 200 is made up of a thin film conductor pattern formed on a front surface 212 of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces of the plate. However, SM XBARs may be fabricated on piezoelectric plates with other crystallographic orientations.

The back surface 214 of the piezoelectric plate 210 is attached to, and mechanically supported by, a substrate 220. The substrate 220 may be, for example, silicon, sapphire, quartz, or some other material. As will be described subsequently, the piezoelectric plate 210 may be attached to the substrate 220 via a plurality of intermediate material layers.

The conductor pattern of the SM XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT. Each finger of the first and second pluralities of fingers may be parallel to the X axis of the piezoelectric plate 210.

The first and second busbars 232, 234 serve as the terminals of the SM XBAR 200. A radio frequency or microwave signal applied between the two busbars 232, 234 of the IDT 230 excites an acoustic wave within the piezoelectric plate 210. As will be discussed in further detail, the excited acoustic wave is a bulk shear wave that propagates in the direction normal to the surface of the piezoelectric plate 210, which is also normal, or transverse, to the direction of the electric field created by the IDT fingers. Thus, the SM XBAR is considered a transversely-excited film bulk wave resonator.

For ease of presentation in FIG. 2, the geometric pitch and width of the IDT fingers are greatly exaggerated with respect to the length (dimension L) and aperture (dimension AP) of the SM XBAR. A typical SM XBAR has more than ten parallel fingers in the IDT 210. An SM XBAR may have hundreds, possibly thousands, of parallel fingers in the IDT 210. Similarly, the thickness of the fingers in the cross-sectional views is greatly exaggerated.

Figure 3:
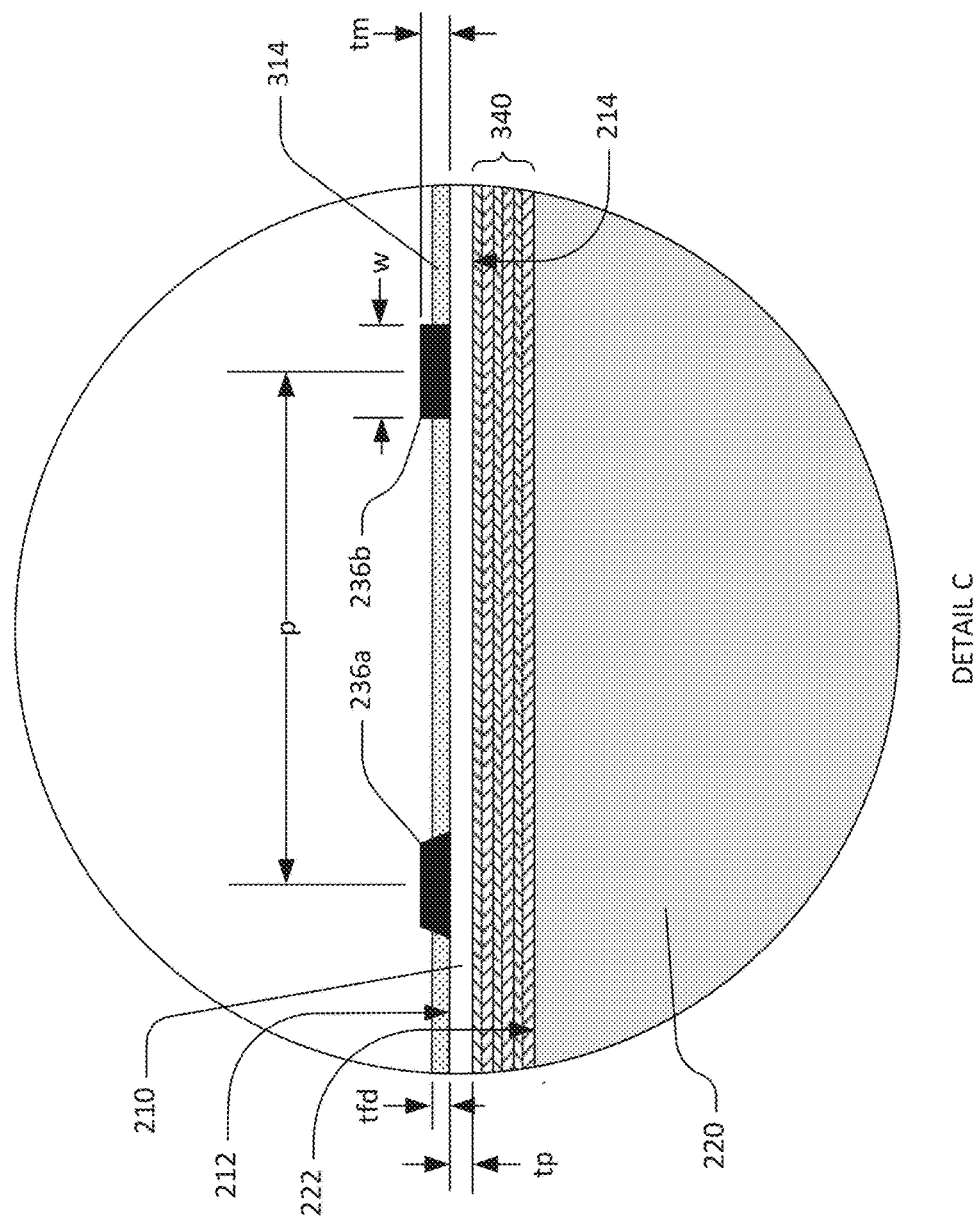
FIG. 3 is an expanded schematic cross-sectional view of a portion of the SM XBAR of FIG. 2.

FIG. 3 shows a detailed schematic cross-sectional view of the SM XBAR 200. The piezoelectric plate 210 is a single-crystal layer of piezoelectrical material having a thickness tp. The value of tp is approximately one-half of the bulk acoustic wavelength at the resonance frequency. tp may be, for example, 50 nm to 200 nm for applications at frequencies from about 9 GHz to 30 GHz. When used in filters for communications devices operating in one of the 27 GHz bands, the thickness tp may be, for example, 50 nm to 90 nm.

A front-side dielectric layer 314 may optionally be formed on the front surface 212 of the piezoelectric plate 210. The front-side dielectric layer 314 has a thickness tfd. The front-side dielectric layer 314 may be formed between the IDT fingers 236a, 236b. Although not shown in FIG. 2, the front side dielectric layer 314 may also be deposited over the IDT fingers 236a, 236b. The front-side dielectric layer 314 may be a non-piezoelectric dielectric material, such as silicon dioxide or silicon nitride. tfd may be, for example, 0 to not more than 30% of the thickness tp of the piezoelectric plate 210.

The IDT fingers 236a, 236b may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers. The cross-sectional shape of the IDT fingers may be trapezoidal (e.g. IDT finger 236a) or rectangular (e.g. IDT finger 236b), or some other shape (not shown).

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the ratio of the finger width to the pitch of a SAW resonator IDT is typically close to 0.5 (i.e. the mark or finger width w is about one-fourth of the acoustic wavelength at resonance). In an SM XBAR, the width w of the IDT fingers is typically 0.2 to 0.3 times the pitch p of the IDT.

The pitch p of the IDT may be 2 to 20 times the thickness tp of the piezoelectric plate 210. When used in filters for communications devices operating in one of the 27 GHz communications bands, the pitch p is typically 8 to 15 times the thickness tp of the piezoelectric plate 210. The thickness tm of the IDT fingers 236a, 236b is typically 0.8 to 1.5 times the thickness tp of the piezoelectric plate 210. The thickness of the busbars (232, 234 in FIG. 2) of the IDT may be the same as, or greater than, the thickness tm of the IDT fingers.

An acoustic Bragg reflector 340 is sandwiched between a surface 222 of the substrate 220 and the back surface 214 of the piezoelectric plate 110. The term "sandwiched" means the acoustic Bragg reflector 340 is both disposed between and physically connected to the surface 222 of the substrate 220 and the back surface 214 of the piezoelectric plate 210. In some circumstances, thin layers of additional materials may be disposed between the acoustic Bragg reflector 340 and the surface 222 of the substrate 220 and/or between the Bragg reflector 340 and the back surface 214 of the piezoelectric plate 210. Such additional material layers may be present, for example, to facilitate bonding the piezoelectric plate 210, the acoustic Bragg reflector 340, and the substrate 220.

The acoustic Bragg reflector 340 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. All of the high acoustic impedance layers of the acoustic Bragg reflector 340 are not necessarily the same material, and all of the low acoustic impedance layers are not necessarily the same material.

Dielectric materials having comparatively low acoustic impedance include silicon dioxide, silicon oxycarbide, and certain plastics such as cross-linked polyphenylene polymers. Materials having comparatively high acoustic impedance include silicon nitride, aluminum nitride, silicon carbide, diamond, diamond-like carbon (DLC), cubic boron nitride (c-BN), and hafnium oxide. Aluminum has comparatively low acoustic impedance and other metals such as molybdenum, tungsten, gold, and platinum have comparatively high acoustic impedance. However, the presence of metal layers in the acoustic Bragg reflector 340 will distort the electric field generated by the IDT fingers and substantially reduce the electromechanical coupling of the SM XBAR. Thus, all of the layers of the acoustic Bragg reflector 340 may be dielectric materials.

In the example of FIG. 2, the acoustic Bragg reflector 340 has a total of six layers or three pairs of layers. An acoustic Bragg reflector may have more than, or less than, six layers.

Figure 4:
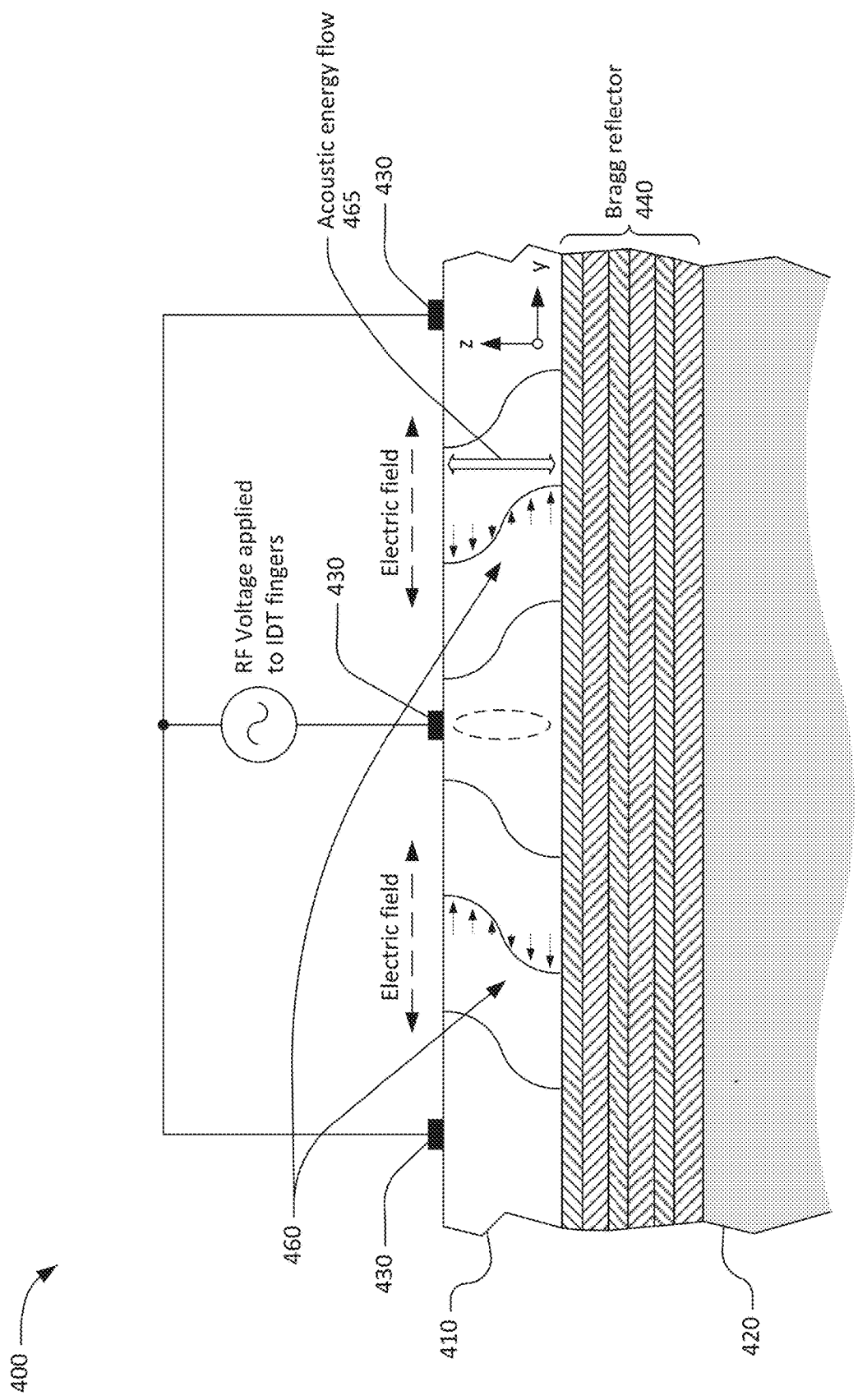
FIG. 4 is a graphic illustrating a shear primary acoustic mode in an SM XBAR.

FIG. 4 is a graphical illustration of the primary acoustic mode in a SM XBAR 400. FIG. 4 shows a small portion of the SM XBAR 400 including a piezoelectric plate 410 and three interleaved IDT fingers 430. The piezoelectric plate 410 may be single-crystal lithium niobate cut such that the z-axis is normal to the surfaces of the plate. The IDT fingers may be oriented parallel to the x-axis of the plate such that the y-axis is normal to the fingers.

An RF voltage applied to the interleaved fingers 430 creates a time-varying electric field between the fingers. In the regions between the IDT fingers 430, the direction of the electric field is predominantly lateral, or parallel to the surface of the piezoelectric plate 410, and orthogonal to the length of the IDT fingers, as indicated by the dashed arrows labeled "electric field". Due to the high dielectric constant of the piezoelectric plate, the electric field is highly concentrated in the plate relative to the air. The lateral electric field excites acoustic waves in the piezoelectric plate 410. In an XBAR, the piezoelectric plate and the IDT are configured such that the lateral electric field causes shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 410 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the primary shear acoustic mode is substantially orthogonal to the surface of the piezoelectric plate, as indicated by the arrow 465. Other secondary or spurious acoustic modes may also be excited in addition to the primary shear acoustic mode.

An acoustic Bragg reflector 440 is sandwiched between the piezoelectric plate 410 and a substrate 420. The acoustic Bragg reflector 440 reflects the acoustic waves of the primary acoustic mode to keep the acoustic energy (arrow 465) predominantly confined to the piezoelectric plate 410. The acoustic Bragg reflector 440 for an XBAR consists of alternating layers of materials having relatively high and relatively low acoustic impedance, with each layer having a thickness of about one-quarter of the wavelength of the shear acoustic waves (arrow 465) at resonance frequency of the XBAR 400. In the example of FIG. 4, the acoustic Bragg reflector 440 has a total of six layers. An acoustic Bragg reflector may have more than, or less than, six layers.

Figure 5:
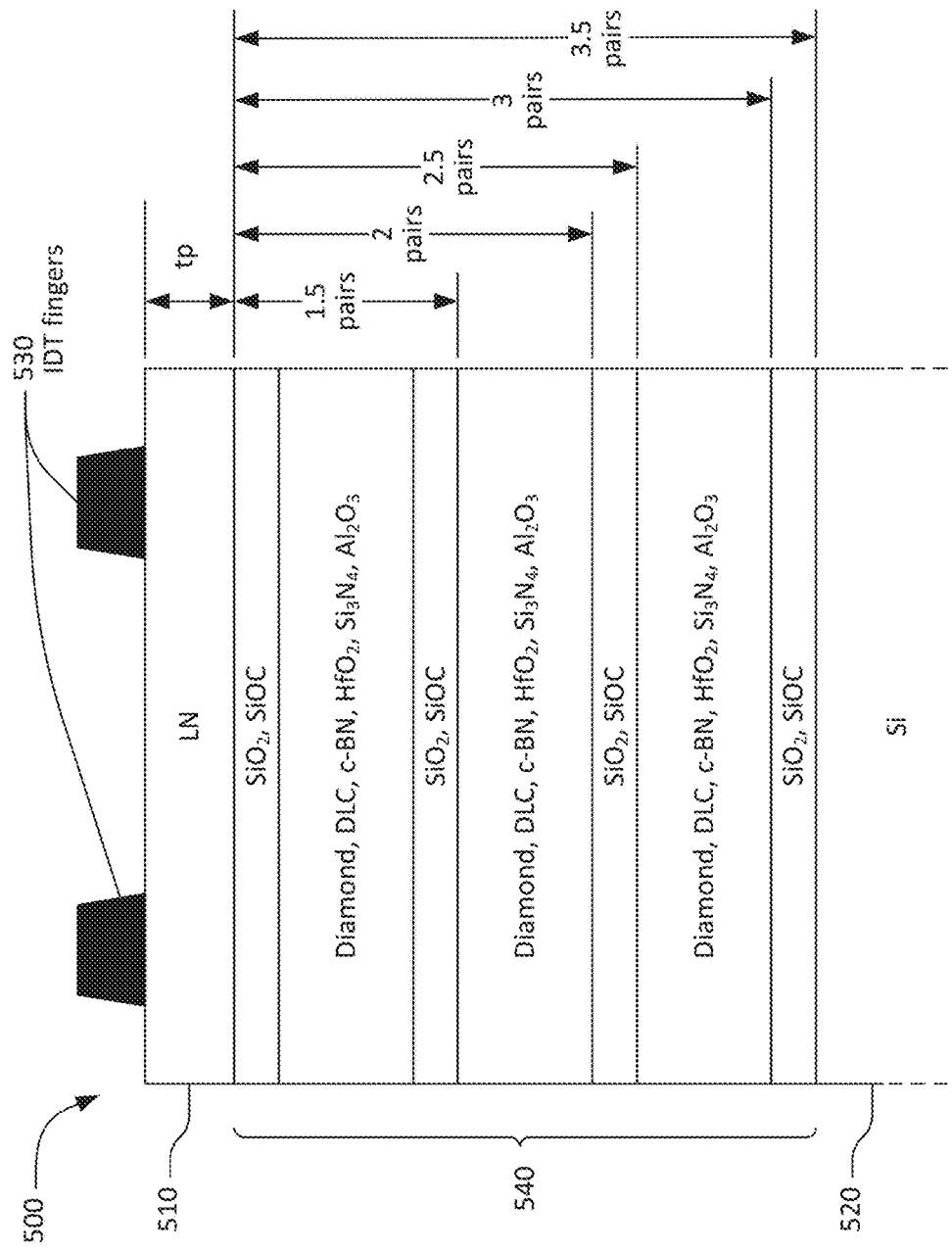
FIG. 5 is an expanded schematic cross-sectional view of a portion of an exemplary SM XBAR.

FIG. 5 is a schematic cross-sectional view of a SM XBAR 500 with an acoustic Bragg reflector 540 comprising alternating low acoustic impedance and high acoustic impedance dielectric layers. The low acoustic impedance layers may before example, $SiO_2$ or carbon-containing silicon oxide (SiOC). The high acoustic impedance layers may be, for example, diamond, diamond-like carbon (DLC), cubic boron nitride (c-BN), $HfO_2$, $Si_3N_4$, or $Al_2O_3$. The acoustic Bragg reflector 540 is sandwiched between a piezoelectric plate 510 and a substrate 520. The piezoelectric plate may be lithium niobate (LN) or lithium tantalate or some other material. The piezoelectric plate may be Z-cut (i.e. Z axis perpendicular to the surfaces), rotated Z-cut or rotated Y-cut LN. The substrate 520 may be silicon or some other material. The acoustic Bragg reflector 540 has a total of seven layers, or 3.5 pairs of layers.

The Q-factor of an acoustic resonator is defined as the energy stored in the resonator divided by the energy lost during one radian of the RF input to the resonator. The energy lost in the resonator has various components including resistive losses in the conductors, acoustic or viscous losses in the conductors and piezoelectric plate, energy lost to spurious resonant modes, and, for SM-XBARs, energy lost by leakage through the acoustic Bragg reflector into the substrate. Individual Q-factors may be defined for each of the loss components such that $$1/Q = 1/Q_{BR} + 1/Q_R + 1/Q_A + \ldots \quad (1)$$

where Q is the overall Q-factor of the resonator and $Q_{BR}$, $Q_R$, and $Q_A$ are the Q-factors for leakage through the Bragg grating, resistive losses, and acoustic losses, respectively. $Q_{BR}$ is equivalent to the Q-factor of an otherwise ideal resonator with no losses other than leakage through the acoustic Bragg reflector. Many of these Q-factors are dependent on frequency.

Figure 6:
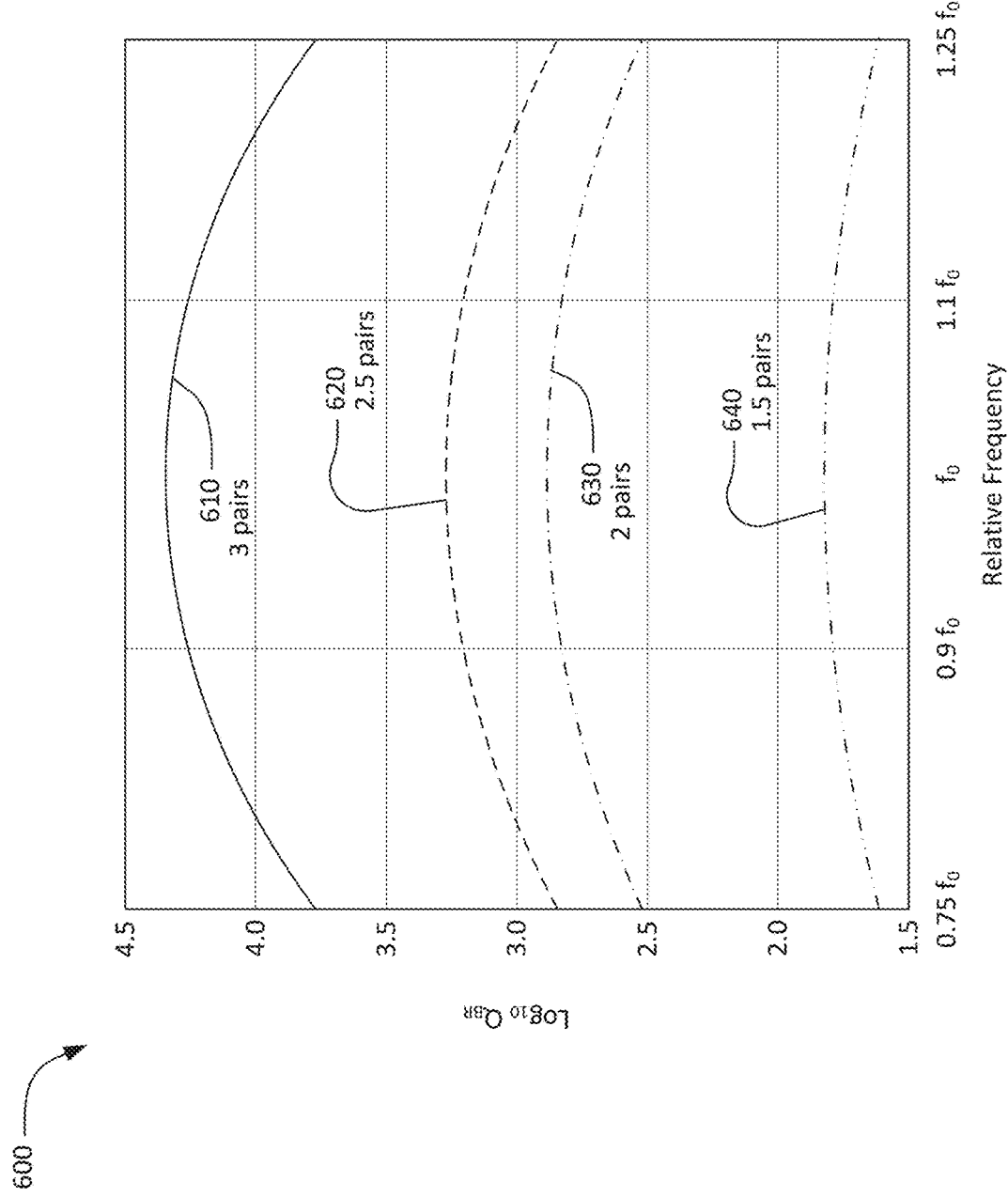
FIG. 6 is a chart showing the dependence of the Q-factor of the SM XBAR of FIG. 5 on the number of layers in the acoustic Bragg reflector.

FIG. 6 is a chart showing the relationship between $Q_{BR}$ and the number of layers in an acoustic Bragg reflector composed of alternating $SiO_2$ and diamond layers. Specifically, FIG. 6 is graph of $Log_{10} Q_{BR}$ versus relative frequency with number of layers as a parameter. $f_0$ is the center frequency of the Bragg reflector, which is to say the frequency at which the effective thickness of the layers of the acoustic Bragg reflector are ¼ wavelength.

The solid line 610 is a plot of $Q_{BR}$ for SM XBARs with an acoustic Bragg reflector with 3 pairs of $SiO_2$/Diamond layers (6 total layers). The dashed line 620 is a plot of $Q_{BR}$ for SM XBARs with an acoustic Bragg reflector with 2.5 pairs of $SiO_2$/Diamond layers (5 total layers). The dot-dash line 630 is a plot of $Q_{BR}$ for SM XBARs with an acoustic Bragg reflector with 2 pairs of $SiO_2$/Diamond layers (4 total layers). The dot-dot-dash line 640 is a plot of $Q_{BR}$ for SM XBARs with an acoustic Bragg reflector with 1.5 pairs of $SiO_2$/Diamond layers (3 total layers). An acoustic Bragg reflector with 2.5 pairs of alternating $SiO_2$ and diamond layers may be sufficient for most XBAR filters. Acoustic Bragg reflectors using material other than $SiO_2$ and diamond may require more than 2.5 pairs of layers. The data shown in FIG. 6 results from simulation using a finite element method.

Figure 7:
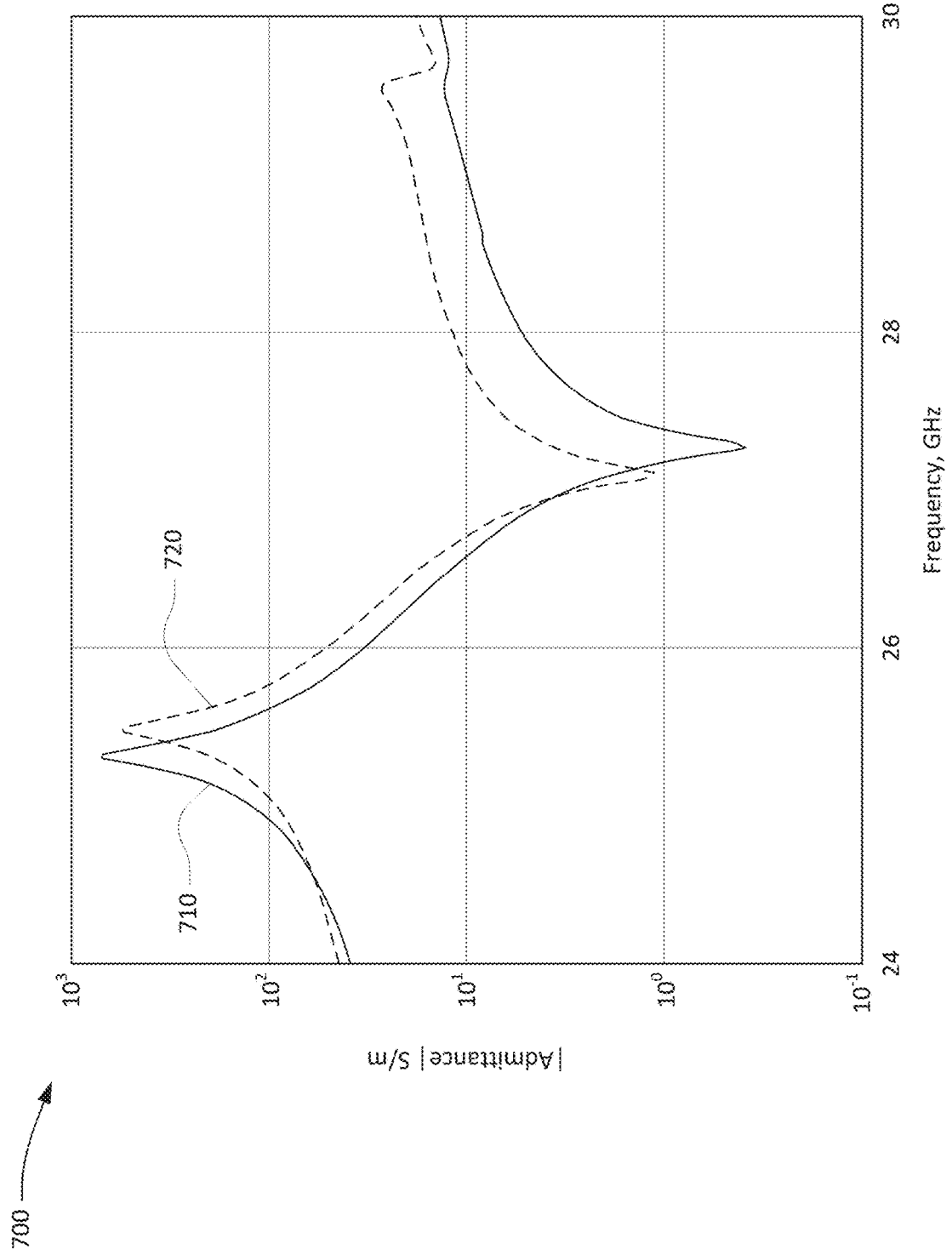
FIG. 7 is a graph showing the magnitude of admittance versus frequency for representative SM-XBARs.

FIG. 7 is a chart 700 of the normalized magnitude of the admittance (on a logarithmic scale) versus frequency for two representative SM XBARs having structures similar to the SM XBAR 500 of FIG. 5. The data is FIG. 7 is based on simulation of the SM XBAR structures using a finite element method.

Specifically, the solid curve 710 is a plot of the magnitude of admittance of an SM XBAR including a Z-cut LN piezoelectric plate with a thickness tp of 71 nm. The pitch, width, and thickness of the aluminum IDT fingers are 1 μm, 250 nm, and 80 nm, respectively. The acoustic Bragg reflector includes three pairs of alternating $SiO_2$ and DLC layers with thicknesses of 40 nm and 136 nm, respectively. There is no front side dielectric layer. The resonance frequency Fr is 25.3 GHz, the anti-resonance frequency Far is 27.3 GHz, and the R-aR bandwidth is 7.7%. R-aR bandwidth is defined as (Fr–Far)/Fr.

The dashed curve 720 is a plot of the magnitude of admittance of an SM XBAR with the same construction as the previous example except the Bragg reflector is alternating $SiO_2$ and $HfO_2$ layers. The resonance frequency Fr is 25.5 GHz, the anti-resonance frequency Far is 27.1 GHz, and the R-aR bandwidth is 6.2%.

Figure 8:
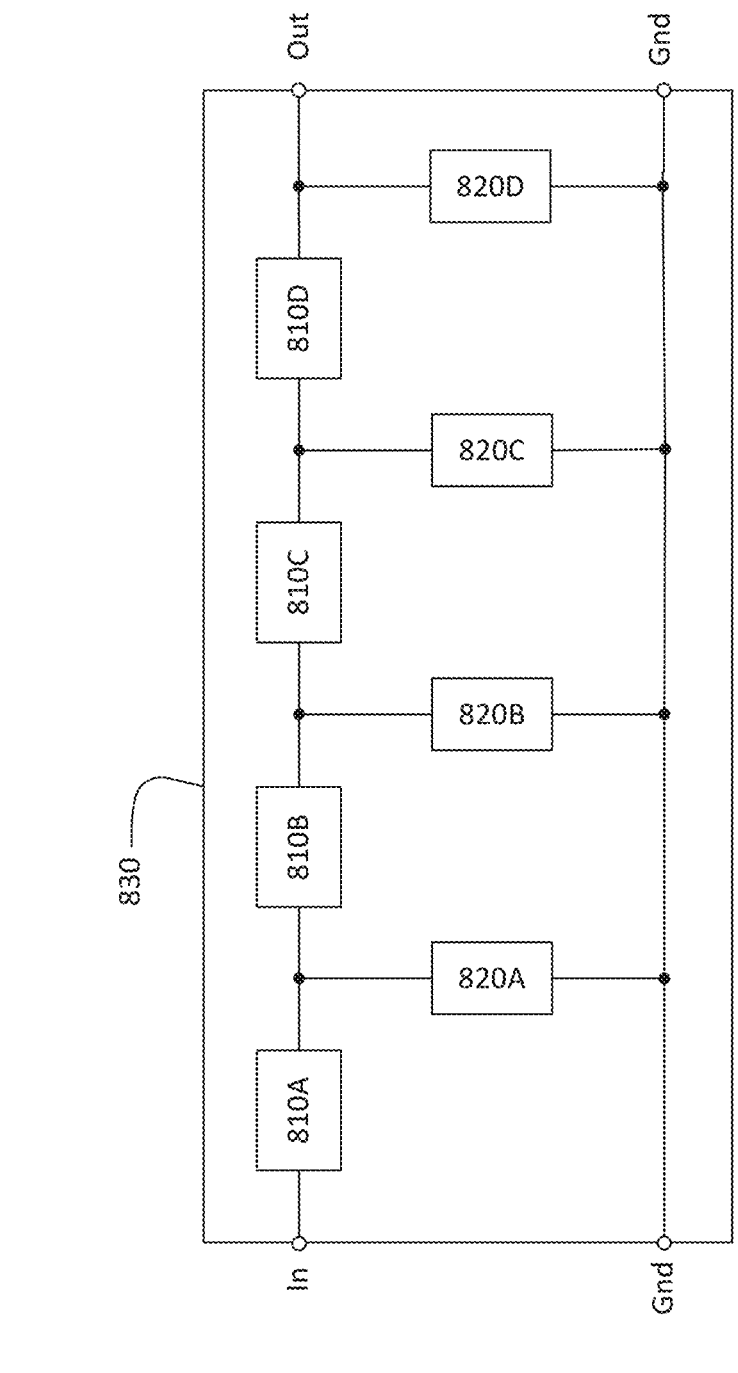
FIG. 8 is a block diagram of a filter including eight SM XBARs.

FIG. 8 is a schematic circuit diagram for a high frequency band-pass filter 800 using SM XBARs. The filter 800 has a conventional ladder filter architecture including four series resonators 810A, 810B, 810C, 810D and four shunt resonators 820A, 820B, 820C, 820D. The four series resonators 810A, 810B, 810C, and 810D are connected in series between a first port and a second port. In FIG. 8, the first and second ports are labeled "In" and "Out", respectively. However, the filter 800 is reversible in that either port and serve as the input or output of the filter. The four shunt resonators 820A, 820B, 820C, 820D are connected from nodes between the series resonators to ground. All the shunt resonators and series resonators are SM XBARs.

The filter 800 may include a substrate having a surface, a single-crystal piezoelectric plate having parallel front and back surfaces, and an acoustic Bragg reflector sandwiched between the surface of the substrate and the back surface of the single-crystal piezoelectric plate. The substrate, acoustic Bragg reflector, and piezoelectric plate are represented by the rectangle 830 in FIG. 8. A conductor pattern formed on the front surface of the single-crystal piezoelectric plate includes interdigital transducers (IDTs) for each of the four series resonators 810A, 8110B, 810C, 810D and four shunt resonators 820A, 820B, 820C, 820D. All of the IDTs are configured to excite shear acoustic waves in the single-crystal piezoelectric plate in response to respective radio frequency signals applied to each IDT.

In a ladder filter, such as the filter 800, the resonance frequencies of shunt resonators are typically lower than the resonance frequencies of series resonators. The resonance frequency of an SM XBAR resonator is primarily determined by the thickness of the material stack above the acoustic Bragg reflector, which is to say the combined thickness of the piezoelectric plate and top side dielectric layer(s) if present. The resonance frequency of an SM XBAR is slightly dependent on IDT pitch and, to an even smaller extent, IDT finger width. IDT pitch and finger width also impacts other filter parameters including impedance and power handling capability. For 27 GHz communications band filter applications, it may not be practical to provide the required difference between the resonance frequencies of shunt and series resonators using only differences in IDT pitch and finger width. The required difference between the resonance frequencies of shunt and series resonators can be achieved by using different material stack thicknesses for series and shunt resonator.

FIG. 9A is a schematic cross-sectional view though a shunt resonator and a series resonator of a filter 900A that uses dielectric thickness to separate the frequencies of shunt and series resonators. An acoustic Bragg reflector 940 is sandwiched between a piezoelectric plate 910A and a substrate 920. The piezoelectric plate 910A has a uniform thickness. Interleaved IDT fingers, such as finger 930, are formed on the piezoelectric plate 910A. A first dielectric layer 950, having a thickness t1, is deposited over the shunt resonator. A second dielectric layer 955, having a thickness t2, is deposited over both the shunt and series resonator. Alternatively, a single dielectric layer having thickness t1+t2 may be deposited over both the shunt and series resonators. The dielectric layer over the series resonator may then be thinned to thickness t2 using a masked dry etching process. In either case, the difference between the overall thickness of the dielectric layers (t1+t2) over the shunt resonator and the thickness t2 of the dielectric layer over the series resonator defines a frequency offset between the series and shunt resonators.

The second dielectric layer 955 may also serve to seal and passivate the surface of the filter 900A. The second dielectric layer may be the same material as the first dielectric layer or a different material. The second dielectric layer may be a laminate of two or more sub-layers of different materials. Alternatively, an additional dielectric passivation layer (not shown in FIG. 9A) may be formed over the surface of the filter 900A. Further, as will be described subsequently, the thickness of the final dielectric layer (i.e. either the second dielectric layer 955 or an additional dielectric layer) may be locally adjusted to fine-tune the frequency of the filter 900A. The final dielectric layer can be referred to as the "passivation and tuning layer".

FIG. 9B is a schematic cross-sectional view though a shunt resonator and a series resonator of a filter 900B that uses piezoelectric plate thickness to separate the frequencies of shunt and series resonators. An acoustic Bragg reflector 940 is sandwiched between a piezoelectric plate 910B and a substrate 920. Interleaved IDT fingers, such as finger 930, are formed on the diaphragms. The diaphragm of the shunt resonator has a thickness t3. The piezoelectric plate 910B is selectively thinned (for example, as described in U.S. Pat. No. 11,201,601) such that the diaphragm of the series resonator has a thickness t4, which is less than t3. The difference between t3 and t4 defines a frequency offset between the series and shunt resonators. A passivation and tuning layer 955 may be deposited over both the shunt and series resonators.

A filter using SM XBARS is not limited to either two dielectric thicknesses as shown in FIG. 9A or two piezoelectric plate thicknesses as shown in FIG. 9B. Filters may use three or more dielectric thicknesses, three or more piezoelectric plate thicknesses, or a combination of multiple dielectric thicknesses and multiple piezoelectric plate thicknesses.

Figure 10:
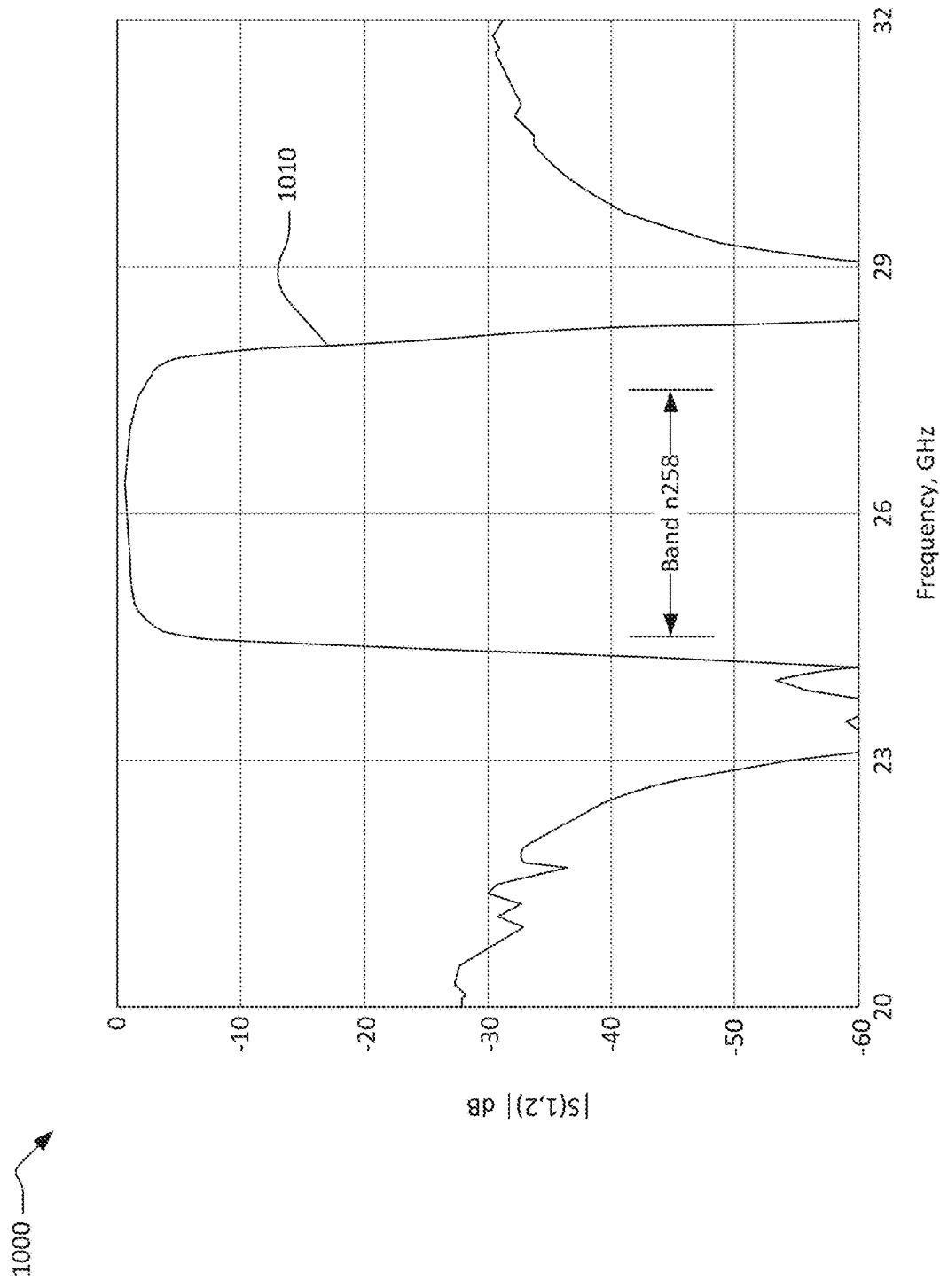
FIG. 10 is a graph of input/output transfer function S(1,2) for a filter implemented with SM-XBARs.

FIG. 10 is a chart 1000 illustrating the application of SM XB ARS in bandpass filters for K band communications devices. The solid curve 1010 is a plot of the magnitude of the input-output transfer function S(1,2) of an exemplary filter for 5G NR band n258. This filter includes eight SM XBARs connected in a ladder filter circuit as shown in FIG. 8 with shunt impedance matching inductors (not shown in FIG. 8) across the input and output ports. The data results from simulation of the filter using a finite element technique. All eight XBARs are on a common silicon substrate with a common acoustic Bragg reflector with 4 pairs of alternating $SiO_2$ and DLC layers. The piezoelectric plate is Z-cut LN with a thickness of 68 nm for series resonators and 79 nm for three of the four shunt resonators and 81.5 nm for the fourth shunt resonator. The IDT electrode are aluminum 90 nm thick. The pitch of the IDTs ranges from 0.775 μm to 1.1 μm. The IDT finger width to pitch ratio is 0.235 or 0.25 for all SM XBARs. The IDT pitch to piezoelectric plate thickness ratio ranges between 9.8 and 16. Resonance frequencies of shunt resonators are between 23.2 GHz and 24.2 GHz, which are below the lower edge of the filter passband. Resonance frequencies of series resonators are between 26.3 and 26.7 GHz, which are within the filter passband.

Description of Methods

Figure 11:
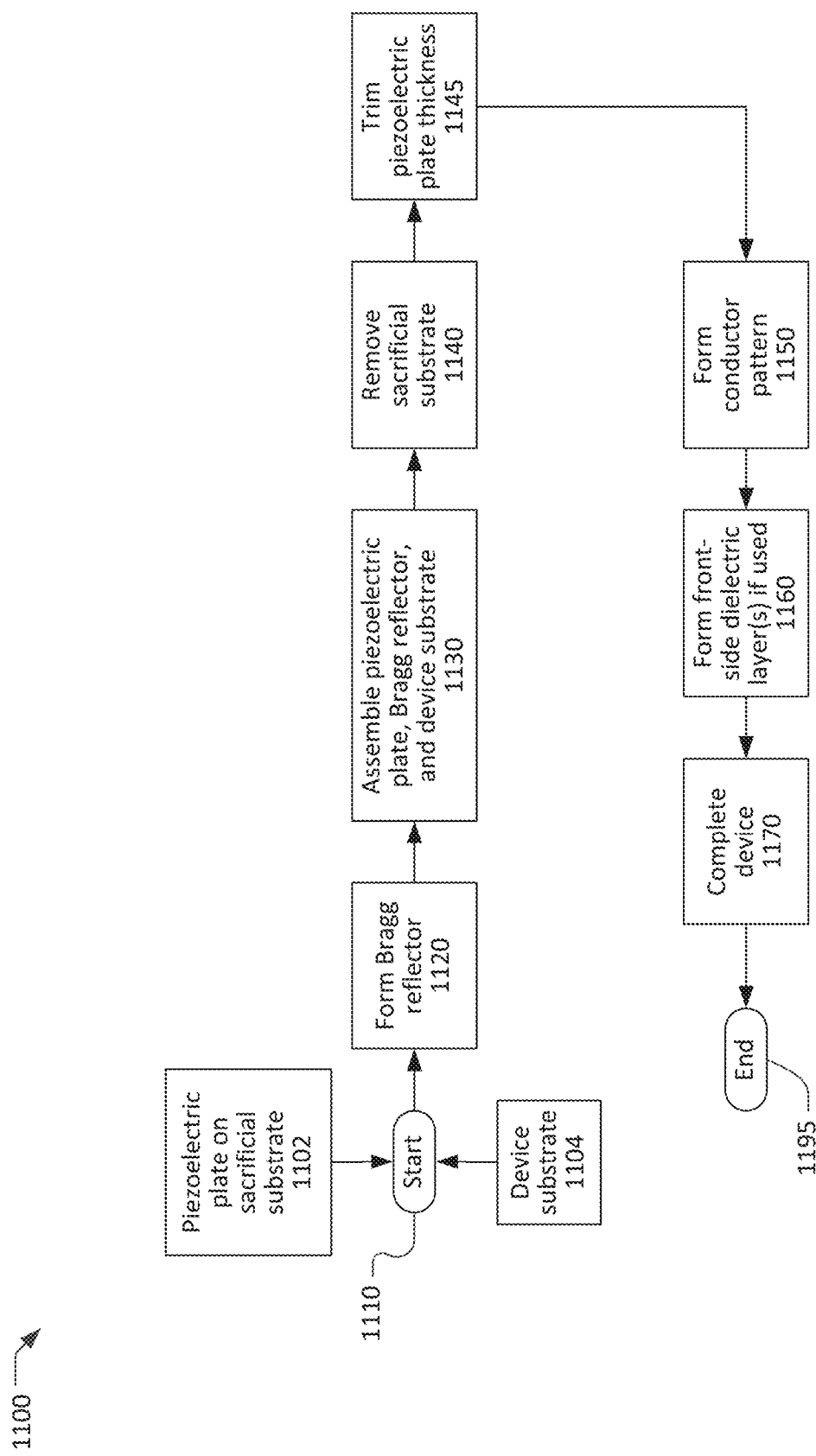
FIG. 11 is a flow chart for a process to fabricate an SM-XBAR.

FIG. 11 is a simplified flow chart of a method 1100 for making a SM XBAR or a filter incorporating SM XBARs. The method 1100 starts at 1110 with a piezoelectric film disposed on a sacrificial substrate 1102 and a device substrate 1104. The method 1110 ends at 1195 with a completed SM XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 50 nm and 200 nm. The thickness of the piezoelectric plate at 1102 may be equal to a desired final thickness. The thickness of the piezoelectric plate at 1102 may be greater than the final thickness and may be trimmed to the final thickness at a later step in the process 1100. When the substrate is silicon, a layer of $SiO_2$ may be disposed between the piezoelectric plate and the substrate. The piezoelectric plate 1102 may be, for example, z-cut lithium niobate bonded to a silicon wafer with an intervening $SiO_2$ layer. The device substrate 1104 may be silicon (as used in the previous examples) fused silica, quartz, or some other material.

At 1120 an acoustic Bragg reflector is formed by depositing alternating layers of materials having low and high acoustic impedance as previously described. Each of the layers has a thickness equal to or about one-fourth of the acoustic wavelength. The total number of layers in the acoustic Bragg reflector may typically be from five to eight.

At 1120, all of the layers of the acoustic Bragg reflector may be deposited on either the surface of the piezoelectric plate on the sacrificial substrate 1102 or a surface of the device substrate 1104. Alternatively, some of the layers of the acoustic Bragg reflector may be deposited on the surface of the piezoelectric plate on the sacrificial substrate 1102 and the remaining layers of the acoustic Bragg reflector may be deposited on a surface of the device substrate 1104.

At 1130, the piezoelectric plate on the sacrificial substrate 1102 and the device substrate 1104 may be bonded such that the layers of the acoustic Bragg reflector are sandwiched between the piezoelectric plate and the device substrate. The piezoelectric plate on the sacrificial substrate 1102 and the device substrate 1104 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1102 and the device substrate 1104 are bonded, the sacrificial substrate, and any intervening layers, are removed at 1140 to expose the surface of the piezoelectric plate (the surface that previously faced the sacrificial substrate). The sacrificial substrate may be removed, for example, by material-dependent wet or dry etching or some other process.

A variation of the method from 1110 to 1140 starts with a single-crystal piezoelectric wafer at 1102 instead of a thin piezoelectric plate on a sacrificial substrate of a different material. Ions are implanted to a controlled depth beneath a surface of the piezoelectric wafer (not shown in FIG. 11). The portion of the wafer from the surface to the depth of the ion implantation is (or will become) the thin piezoelectric plate and the balance of the wafer is the sacrificial substrate. The acoustic Bragg reflector is formed at 1120 as previously described and the piezoelectric wafer and device substrate are bonded at 1130 such that the acoustic Bragg reflector is disposed between the ion-implanted surface of the piezoelectric wafer 1102 and the device substrate 1104. At 1140, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing". The thickness of the piezoelectric plate after ion slicing may be equal to or greater than the desired final thickness.

At 1145, the thickness of the piezoelectric plate may be adjusted or trimmed to a desired final thickness. Trimming may include, for example, polishing or chemo-mechanical polishing the surface of the piezoelectric plate. Trimming may include globally or selectively removing material from the surface of the piezoelectric plate using an ion mill or other material removal tool. Trimming may include measuring a thickness profile of the piezoelectric plate and then removing material by polishing, ion milling, or some other technique based on the thickness profile to improve the thickness uniformity of the piezoelectric plate. Trimming may include applying a mask and removing material from selected regions of the piezoelectric plate (e.g. regions that will become series resonators). When fabricating filters for 27 GHz communications bands, the final thickness of the piezoelectric plate may be, for example, 50 nm to 90 nm.

After the thickness of the piezoelectric plate is trimmed at 1145, a conductor pattern, including IDTs of each SM XBAR, is formed at 1150 by depositing and patterning one or more conductor layers on the trimmed surface of the piezoelectric plate. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. When the conductor layer is substantially aluminum, the IDT finger thickness may be from 0.8 to 1.5 times the final thickness of the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1150 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1150 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1160, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1150 and 1160, the filter device may be completed at 1170. Actions that may occur at 1170 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1170 is to tune the resonant frequencies of the resonators within the device by adding or removing metal or dielectric material from the front side of the device. After the filter device is completed, the process ends at 1195.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

The invention claimed is:

1. An acoustic resonator comprising:
    a substrate;
    a piezoelectric plate having front and back surfaces and having a piezoelectric plate thickness between the front and back surfaces that is greater than or equal to 50 nm and less than or equal to 200 nm;
    an acoustic Bragg reflector between the substrate and the back surface of the piezoelectric plate; and
    a conductor pattern comprising an interdigital transducer (IDT) on the front surface of the piezoelectric plate,
    wherein the IDT comprises interleaved fingers on the piezoelectric plate and at least a portion of the interleaved fingers have a width that is greater than or equal to 0.2 times a pitch of the IDT and less than or equal to 0.3 times the pitch of the IDT.

2. The acoustic resonator of claim 1, wherein the IDT and the piezoelectric plate are configured such that a radio frequency signal applied to the IDT excites a primary shear acoustic mode within the piezoelectric plate, and the acoustic Bragg reflector is configured to reflect the primary shear acoustic mode.

3. The acoustic resonator of claim 1, wherein the piezoelectric plate is one of lithium niobate and lithium tantalate.

4. The acoustic resonator of claim 3, wherein the piezoelectric plate is one of Z-cut, rotated Z-cut, and rotated Y-cut.

5. The acoustic resonator of claim 2, wherein the acoustic Bragg reflector is configured to reflect the primary shear acoustic mode over a frequency range including a resonance frequency and an anti-resonance frequency of the acoustic resonator device.

6. The acoustic resonator of claim 1, wherein the pitch of the interleaved fingers of the IDT is greater than or equal to 8 times the piezoelectric plate thickness and less than or equal to 15 times the piezoelectric plate thickness.

7. A filter device comprising:
a plurality of bulk acoustic resonators connected in a ladder filter circuit, each bulk acoustic resonator of the plurality of bulk acoustic resonators comprising:
a substrate;
a piezoelectric plate having front and back surfaces and a piezoelectric plate thickness between the front and back surfaces that is greater than or equal to 50 nm and less than or equal to 200 nm;
an acoustic Bragg reflector between the substrate and the back surface of the piezoelectric plate; and
a conductor pattern on the front surface of the piezoelectric plate, the conductor pattern comprising an interdigital transducer (IDT),
wherein the plurality of bulk acoustic resonators comprises at least a first shunt resonator and at least a first series resonator, and
wherein a thickness of a first dielectric layer over the IDT of the first shunt resonator is greater than a thickness of a second dielectric layer over the IDT of the first series resonator.

8. The acoustic resonator of claim 1, wherein the interleaved fingers of the IDT are substantially aluminum and an IDT finger thickness is greater than or equal to 0.8 times the piezoelectric plate thickness and less than or equal to 1.5 times the piezoelectric plate thickness.

9. The acoustic resonator of claim 1, wherein the piezoelectric plate thickness is less than or equal to 90 nm.

10. A filter device comprising:
a plurality of bulk acoustic resonators connected in a ladder filter circuit, each bulk acoustic resonator of the plurality of bulk acoustic resonators comprising:
a substrate;
a piezoelectric plate having front and back surfaces and a piezoelectric plate thickness between the front and back surfaces that is greater than or equal to 50 nm and less than or equal to 200 nm;
an acoustic Bragg reflector between the surface of the substrate and the back surface of the piezoelectric plate; and
a conductor pattern on the front surface of the piezoelectric plate, the conductor pattern comprising an interdigital transducer (IDT),
wherein the IDT of each bulk acoustic resonator comprises interleaved fingers on the piezoelectric plate and at least a portion of the interleaved fingers have a width that is greater than or equal to 0.2 times a pitch of the IDT and less than or equal to 0.3 times the pitch of the IDT.

11. The filter device of claim 10, wherein:
the piezoelectric plate and the IDT of each bulk acoustic resonator are configured such that a radio frequency signal applied to the IDT excites a primary acoustic mode in the piezoelectric plate; and
the acoustic Bragg reflector is configured to reflect the primary shear acoustic mode excited by the IDT.

12. The filter device of claim 11, wherein the piezoelectric plate of each bulk acoustic resonator is one of lithium niobate and lithium tantalate.

13. The filter device of claim 12, wherein the piezoelectric plate of each bulk acoustic resonator is one of Z-cut, rotated Z-cut, and rotated Y-cut.

14. The filter device of claim 11, wherein the acoustic Bragg reflector of each bulk acoustic resonator is configured to reflect the primary shear acoustic mode at the resonance and antiresonance frequency of the respective resonator.

15. The filter device of claim 10, wherein the IDT of each bulk acoustic resonator has a respective pitch greater than or equal to 8 times the piezoelectric plate thickness and less than or equal to 15 times the piezoelectric plate thickness.

16. The filter device of claim 10, wherein
a thickness of the piezoelectric plate under the IDT of the first shunt resonator is greater than a thickness of piezoelectric plate under the IDT of the first series resonator.

17. The filter device of claim 10, wherein the interleaved fingers of the IDT of each bulk acoustic resonator are substantially aluminum and an IDT finger thickness is greater than or equal to 0.8 times the piezoelectric plate thickness and less than or equal to 1.5 times the piezoelectric plate thickness.

18. The filter device of claim 10, wherein the piezoelectric plate thickness of each bulk acoustic resonator is less than or equal to 90 nm.

\* \* \* \* \*